(12) United States Patent
Sarpatwari et al.

(10) Patent No.: US 11,355,209 B2
(45) Date of Patent: Jun. 7, 2022

(54) ACCESSING A MULTI-LEVEL MEMORY CELL

(71) Applicant: Micron Technology, Inc., Boise, ID (US)

(72) Inventors: Karthik Sarpatwari, Boise, ID (US); Xuan-Anh Tran, Boise, ID (US); Jessica Chen, Boise, ID (US); Jason A. Durand, Boise, ID (US); Nevil N. Gajera, Meridian, ID (US); Yen Chun Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/926,556

(22) Filed: Jul. 10, 2020

(65) Prior Publication Data

US 2022/0013183 A1      Jan. 13, 2022

(51) Int. Cl.
| | |
|---|---|
| *G11C 16/10* | (2006.01) |
| *G11C 16/34* | (2006.01) |
| *G11C 16/30* | (2006.01) |
| *G11C 16/26* | (2006.01) |

(52) U.S. Cl.
CPC ........ *G11C 16/3459* (2013.01); *G11C 16/102* (2013.01); *G11C 16/26* (2013.01); *G11C 16/30* (2013.01); *G11C 16/3404* (2013.01)

(58) Field of Classification Search
CPC ... G11C 16/3459; G11C 16/102; G11C 16/26; G11C 16/30; G11C 16/3404
USPC .................................................... 365/185.22
See application file for complete search history.

(56) References Cited

U.S. PATENT DOCUMENTS

| | | | |
|---|---|---|---|
| 9,570,170 B2 | 2/2017 | Yoon et al. | |
| 9,799,381 B1 | 10/2017 | Tortorelli et al. | |
| 10,235,294 B1 | 3/2019 | Lu et al. | |
| 10,431,301 B2 | 10/2019 | Mirichigni et al. | |
| 10,566,052 B2 | 2/2020 | Mirichigni et al. | |
| 10,614,880 B2 * | 4/2020 | Jo | G11C 13/004 |
| 2014/0140148 A1 | 5/2014 | An | |

(Continued)

FOREIGN PATENT DOCUMENTS

TW          I683312 B          1/2020

OTHER PUBLICATIONS

PCT Application No. PCT/IB2019/001203, by Di Vincenzo et al., filed Dec. 3, 2019 (63 pages).

(Continued)

*Primary Examiner* — Xiaochun L Chen
(74) *Attorney, Agent, or Firm* — Holland & Hart LLP

(57) ABSTRACT

Methods, systems, and devices for accessing a multi-level memory cell are described. The memory device may perform a read operation that includes pre-read portion and a read portion to access the multi-level memory cell. During the pre-read portion, the memory device may apply a plurality of voltages to a plurality of memory cells to identify a likely distribution of memory cells storing a first logic state. During the read portion, the memory device may apply a first read voltage to a memory cell based on performing the pre-read portion. The memory device may apply a second read voltage to the memory cell during the read portion that is based on the first read voltage. The memory device may determine the logic state stored by the memory cell based on applying the first read voltage and the second read voltage.

35 Claims, 8 Drawing Sheets

(56) References Cited

U.S. PATENT DOCUMENTS

| | | |
|---|---|---|
| 2016/0111150 A1 | 4/2016 | Bazarsky et al. |
| 2017/0345503 A1 | 11/2017 | Kim et al. |
| 2018/0240516 A1* | 8/2018 | Jo .................. G06F 13/1626 |
| 2019/0378568 A1 | 12/2019 | Robustelli |
| 2020/0202928 A1 | 6/2020 | Pio |
| 2020/0219562 A1 | 7/2020 | Hirst et al. |

OTHER PUBLICATIONS

PCT Application No. PCT/IB2019/001204, by Di Vincenzo et al., filed Dec. 3, 2019 (62 pages).

ISA/KR, International Search Report and Written Opinion of the International Searching Authority, Int'l Appl. No. PCT/US2021/039534, dated Oct. 21, 2021, Korean Intellectual Property Office, Seo-gu, Daejeon, Republic of Korea, 11pgs.

Taiwan Intellectual Property Office, "Office Action," issued in connection with ROC (Taiwan) Patent Application No. 110121108, dated Jan. 17, 2022 (3 pages).

\* cited by examiner

ACCESSING A MULTI-LEVEL MEMORY CELL

BACKGROUND

The following relates generally to one or more systems for memory and more specifically to accessing a multi-level memory cell.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. Storing multiple bits of information in a memory cell may be desired to increase a data storage density without increasing a physical memory cell density.

DETAILED DESCRIPTION

Figure 1:
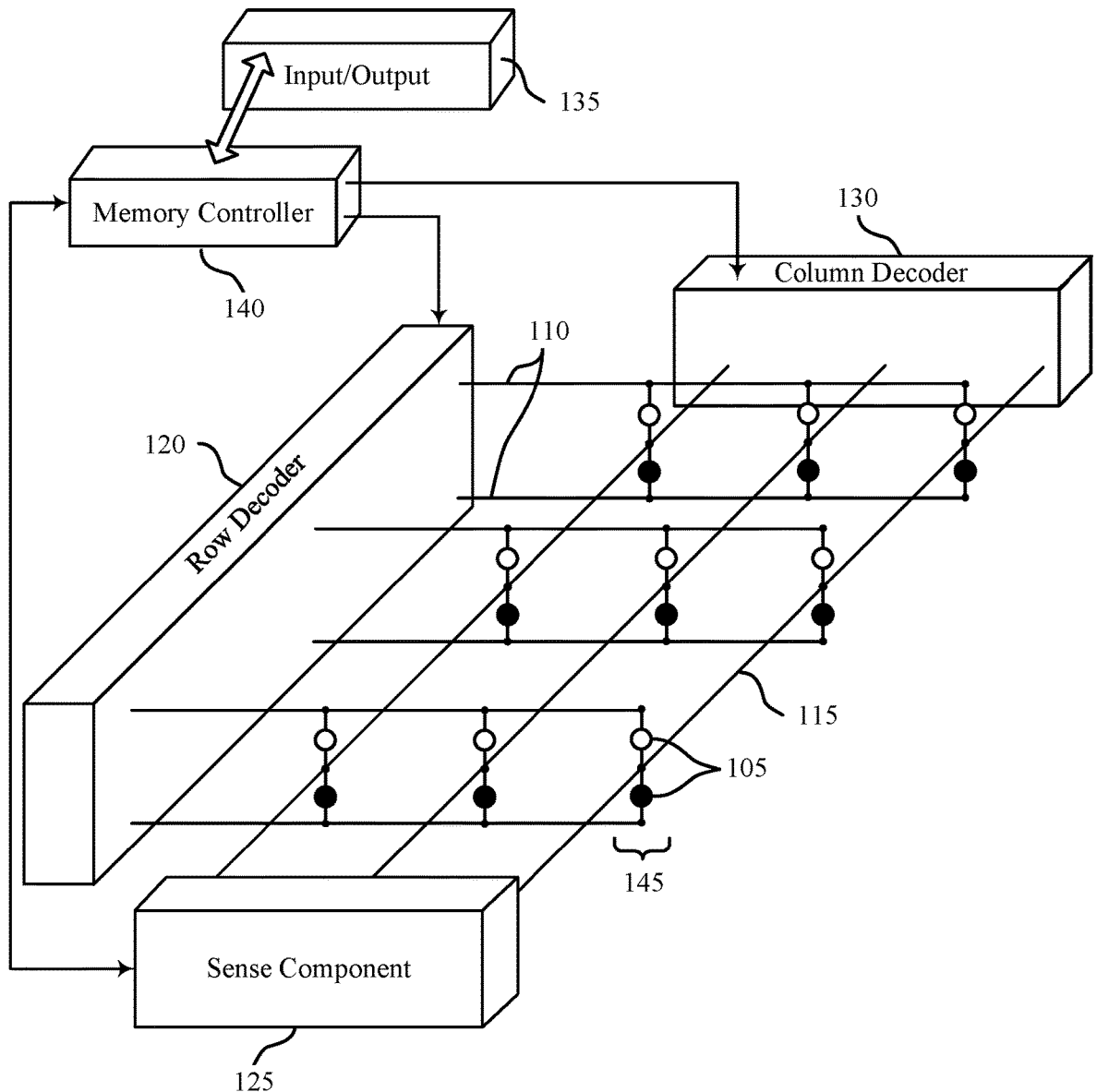
FIG. 1 illustrates an example memory device that supports accessing a multi-level memory cell in accordance with examples as disclosed herein.

A self-selecting memory cell including a chalcogenide material may be an example of a multi-level cell that is configured to store three or more unique states. As such, a single multi-level self-selecting memory cell may be configured to store more than one bit of data. In some cases, a self-selecting memory cell may be selected by applying a bias between a word line and a digit line. The logic state that is stored in a self-selecting memory cell may be based on a polarity of a programming pulse applied to the self-selecting memory cell and the polarity of a read pulse used to detect the state stored by the self-selecting memory cell. For some multi-level self-selecting memory cells, to program one or more intermediate memory states to the self-selecting memory cell, a programming pulse sequence that includes two pulses may be used. In some cases, one or more pulses have the same or different polarities or the same or different magnitudes may be used.

Devices, systems, and techniques are described for accessing a multi-level self-selecting memory cell that stores three or more states. A read operation for a multi-level self-selecting memory cell may include two or more portions, including a pre-read portion and a read portion. During the pre-read portion, a plurality of different voltages may be applied to a plurality of partitions of a memory device. The memory device may identify a likely distribution associated with memory cells that store a first logic state. From that distribution, the memory device may select a first read voltage to distinguish between storing the first logic state and a second logic state based on performing the pre-read portion. The memory device may also select a second read voltage to distinguish between storing the second logic state and a third logic state based on the first read voltage. The memory device may determine the logic state based on applying the first read voltage and the second read voltage.

Accessing the multi-level memory cell by applying a plurality of voltages during the pre-read portion and applying a first and second read voltage during the read portion may improve read margins of a read operation by selecting read voltages based on current conditions in a memory device. In some examples, these techniques may conserve current and power by selecting the first read voltage based on the voltages applied during the pre-read portion. In such cases, a multi-level read that stores three or more logic states per memory cell may increase a quantity of bits accessed per memory cell, thereby improving the performance of the self-selecting memory cell.

Features of the disclosure are initially described in the context of memory arrays as described with reference to FIGS. 1-2. Features of the disclosure are described in the context diagrams showing distributions of threshold voltages and timing diagrams as described with reference to FIGS. 3-4. These and other features of the disclosure are further illustrated by and described with reference to an apparatus diagram and flowcharts that relate to accessing a multi-level memory cell as described with reference to FIGS. 5-8.

FIG. 1 illustrates an example memory device 100 that supports accessing a multi-level memory cell in accordance with examples as disclosed herein. Memory device 100 may also be referred to as an electronic memory apparatus. The components and features of the memory device 100 are shown to illustrate functional interrelationships, may not illustrate their actual physical positions within the memory device 100. The memory device 100 includes a three-dimensional (3D) memory array. The memory array includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

The 3D memory array may include two or more two-dimensional (2D) memory arrays formed on top of one another. This may increase a quantity of memory cells that may be placed or created on a single die or substrate as compared with 2D arrays, which in turn may reduce production costs, or increase the performance of the memory device, or both. Based on the example depicted in FIG. 1, memory array includes two levels of memory cells 105 and may thus be considered a 3D memory array; however, the quantity of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some examples, each row of memory cells 105 is connected to an access line 110, and each column of memory cells 105 is connected to a bit line 115. Access lines 110 and bit lines 115 may be substantially perpendicular to one another and may create an array of memory cells. The two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third material may share a access line 110 with a lower material. In general, one memory cell 105 may be located at the intersection of two conductive lines such as a access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive material, or the like that provides a conductive path between elements or components of memory device 100. In some examples, a memory cell 105 may include a chalcogenide material positioned between a first electrode and a second electrode. One side of the first electrode may be coupled to an access line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and digit line 115. In some examples, access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Thus, by activating a word line 110 and a digit line 115, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, determined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component may be associated either with column decoder or row decoder without losing its functional purposes.

A memory cell 105 may be set or written by similarly activating the relevant word line 110 and digit line 115 and at least three logic values may be stored in the memory cell 105. In some cases, more than three logic values may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a plurality of pre-read voltages during a pre-read portion and then applying a first read voltage and a second read voltage during a read portion. The first read voltage and second read voltage may vary in magnitude and polarity. This process is discussed in more detail below with reference to FIGS. 3A, 3B, 4A, and 4B.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100.

The memory controller 140 may be configured to access a multi-level memory cell. For example, the memory controller 140 may be configured to execute a pre-read portion and a read portion to access the multi-level memory cell. During the pre-read portion, the memory controller 140 may apply a plurality of different voltages to a plurality of partitions of a memory device (e.g., each partition including a quantity of memory cells). The memory controller 140 may identify a distribution associated with memory cells that store a first logic state.

Based on the identified distribution, the memory controller 140 may select a first read voltage to distinguish between storing the first logic state and a second logic state and apply the first read voltage as part of the read portion. The memory controller 140 may then select a second read voltage to distinguish between storing the second logic state and a third logic state, and apply the second read voltage as part of the read portion. The selected second read voltage may be based on the selected first read voltage. The memory device may determine the logic state (e.g., first, second, or third logic states) based on applying the first read voltage and the second read voltage. Accessing the multi-level memory cell via the pre-read portion and the read portion may conserve current and improve the performance of the multi-level memory cell.

Figure 2:
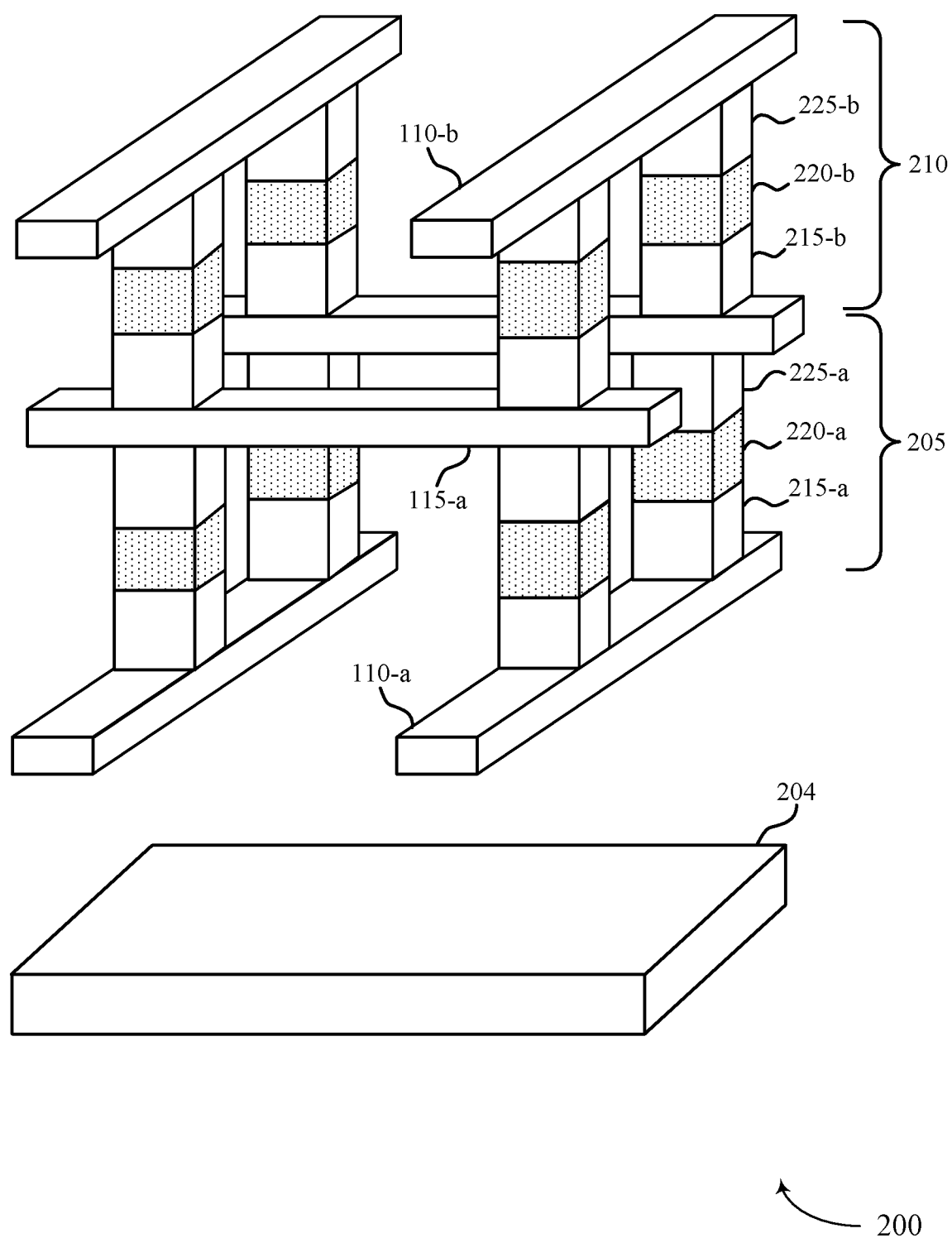
FIG. 2 illustrates an example of a memory array that supports accessing a multi-level memory cell in accordance with examples as disclosed herein.

FIG. 2 illustrates an example of a memory array 200 that supports accessing a multi-level memory cell in accordance with examples as disclosed herein. Memory array 200 may be an example of portions of memory array described with reference to FIG. 1. Memory array 200 may include a first array or deck 205 of memory cells that is positioned above a substrate 204 and second array or deck 210 of memory cells on top of the first array or deck 205. Memory array 200 may also include word line 110-a and word line 110-b, and bit line 115-a, which may be examples of word line 110 and bit line 115, as described with reference to FIG. 1. Memory cells of the first deck 205 and the second deck 210 each may have one or more self-selecting memory cell. Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-a, chalcogenide material 220-a, and second electrode 225-a. In addition, self-selecting memory cells of the second deck 210 may include a first electrode 215-b, chalcogenide material 220-b, and second electrode 225-b. The self-selecting memory cells of the first deck 205 and second deck 210 may, in some examples, have common conductive lines such that corresponding self-selecting memory cells of each deck 205 and 210 may share bit lines 115 or word lines 110 as described with reference to FIG. 1. For example, first electrode 215-b of the second deck 210 and the second electrode 225-a of the first deck 205 may be coupled to bit line 115-a such that bit line 115-a is shared by vertically adjacent self-selecting memory cells.

The architecture of memory array 200 may be referred to as a cross-point architecture in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, DRAM may use a transistor, which is a three-terminal device, as the selection component for each memory cell and may have a larger memory cell area compared to the cross-point architecture.

In some architectures, a plurality of word lines may be formed on parallel planes or tiers parallel to a substrate. The plurality of word lines may be configured to include a plurality of holes to allow a plurality of bit lines formed orthogonally to the planes of word lines such that each of the plurality of bit lines penetrates through a vertically aligned set of holes (e.g., the bit lines vertically disposed with respect to the planes of word lines and the horizontal substrate). Memory cells including storage element (e.g., self-selecting memory cells including a chalcogenide material) may be formed at the crossings of word lines and bit lines (e.g., spaces between the word lines and the bit line in the vertically aligned set of holes). In a similar fashion as described above with reference to FIG. 1, the memory cells (e.g., self-selecting memory cells including a chalcogenide material) may be operated (e.g., read and/or programmed) by selecting respective access lines (e.g., a bit line and a word line) and applying voltage or current pulses.

While the example of FIG. 2 shows two memory decks, other configurations are possible. In some examples, a single memory deck of self-selecting memory cells may be constructed above a substrate 204, which may be referred to as a two-dimensional memory. In some examples, a three or four memory decks of memory cells may be configured in a similar manner in a three-dimensional cross point architecture. In some examples, one or more of the memory decks may include self-selecting memory cells that include chalcogenide material 220. Chalcogenide material 220 may, for example, include a chalcogenide glass such as, for example, an alloy of selenium (Se), tellurium (Te), arsenic (As), antimony (Sb), carbon (C), germanium (Ge), and silicon (Si). In some examples, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a self-selecting memory cell including chalcogenide material 220 may be accessed by applying pre-read voltages and one or more read voltages to the self-selecting memory cell using a bit line 115 and a word line 110. In one example, a controller associated with a self-selecting memory cell may apply a plurality of voltages (e.g., pre-read voltages) to a plurality of self-selecting memory cells. Based on a distribution identified from applying the plurality of voltages, a first read voltage may be determined and applied to the self-selecting memory cell. A second read voltage may be determined based on the determined first read voltage, and applied to the self-selecting memory cell. In such cases, a controller associated with the self-selecting memory cell may determine the logic state stored by the memory cell based on applying the first read voltage and the second read voltage.

Figure 3A:
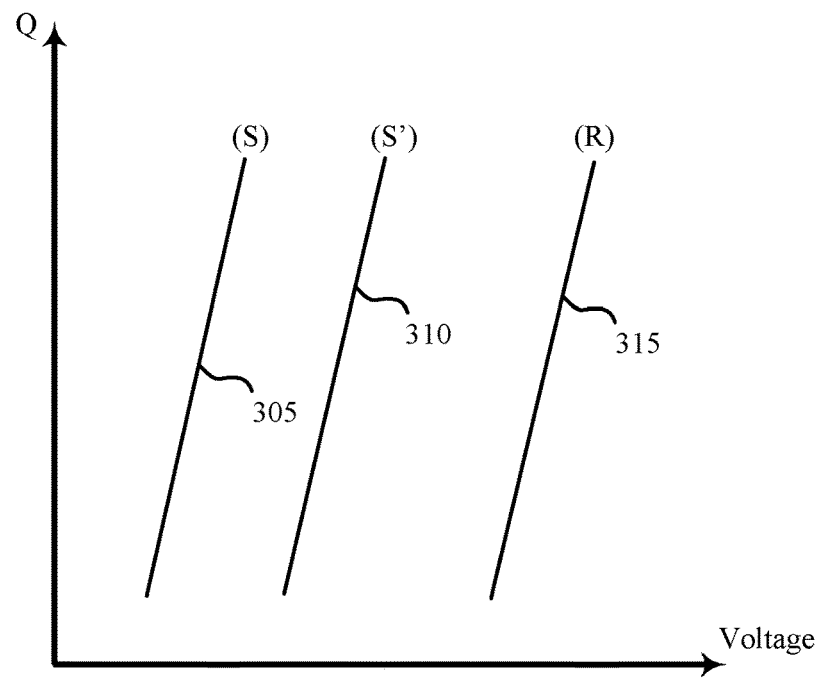
FIG. 3A illustrates an example of a diagram showing distributions of threshold voltages in a self-selecting memory cell that supports accessing a multi-level memory cell in accordance with examples as disclosed herein.

FIG. 3A illustrates an example of a diagram 300 showing distributions of threshold voltages of a self-selecting memory cell that supports that supports accessing a multi-level memory cell in accordance with examples as disclosed herein. A multi-level self-selecting memory cell may be configured to store a logic state that represents multiple bits of data using a multi-level storage techniques. The voltage distributions depict logic states that may be read. The threshold voltage distributions may represent a multi-level cell programming scheme for accessing the multi-level memory cell.

In the example of FIG. 3A, the distribution 305 may represent a set state (e.g., first logic state), the distribution 310 may represent an intermediate state (e.g., second logic state), and the distribution 315 may represent a reset state (e.g., third logic state). In some cases, the distributions 305, 310, and 315 may exhibit a median voltage value (such as a normal quantile) corresponding to a voltage distribution for each logic state. In some examples, two distributions may have an overlapping portion, thus may not have clear separation between the two distributions. In some examples, each distribution may not be symmetrical around its median. In some examples, each distribution may exhibit a different ranges of voltage values. In some cases, the intermediate state (e.g., distribution 310) may be programmed with voltage having a same polarity as the set state (e.g., distribution 305) or the reset state (e.g., distribution 315). In some cases, the diagram 300 may include distributions that represent more than three logic states. For example, the diagram 300 may include distributions that represent a fourth logic state, a fifth logic state, or more logic states.

Figure 3B:
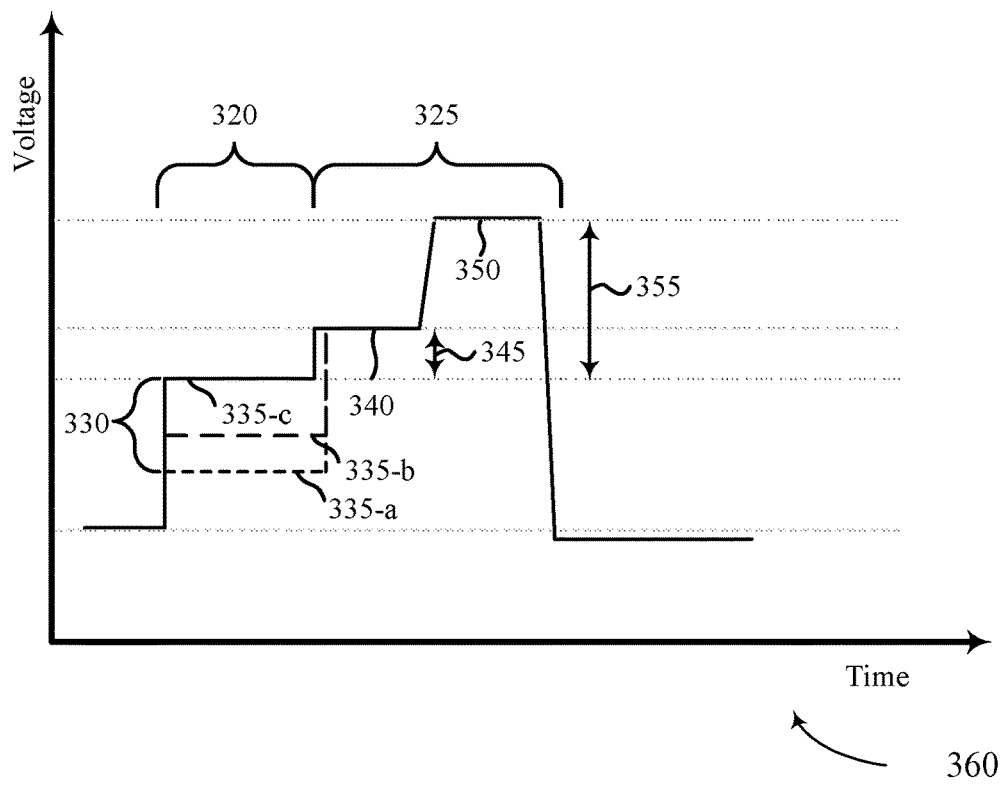
FIG. 3B illustrates an example of a timing diagram that supports accessing a multi-level memory cell in accordance with examples as disclosed herein.

FIG. 3B illustrates an example of a timing diagram 360 that supports accessing a multi-level memory cell in accordance with examples as disclosed herein. The timing diagram 360 may include a pre-read portion 320 and a read portion 325. The timing diagram 360 may plot a magnitude of the voltage of one or more pulses (y-axis) applied to the memory cell with respect to time (x-axis).

The pre-read portion 320 of the timing diagram 360 may include a plurality of voltages 330. The plurality of voltages 330 may be an example of pre-read voltages. During the pre-read portion 320, the plurality of voltages 330 may be applied to different sets of memory cells. For example, the memory device may apply the plurality of voltages 330 to a plurality of memory cells as part of a pre-read portion 320 of a read operation. The pre-read portion of the read operation may be used to determine a distribution for at least one logic state stored by the memory cells. Over time, the voltage thresholds associated with a first logic state stored by memory cells may drift based on changing conditions in the memory device. Using the distribution determined during the pre-read portion, read voltages may be selected that may reduce or mitigate a likelihood of errors during the read operation.

The plurality of voltage 330 may include at least a first voltage 335-$a$, a second voltage 335-$b$, and a third voltage 335-$c$. The plurality of voltages 330 may be a same polarity as the first read voltage 340. In some cases, the magnitude of each of the plurality of voltages 330 may be different than a magnitude 345 of the first read voltage 340. For example, the magnitude of each of the first voltage 335-$a$, the second voltage 335-$b$, and the third voltage 335-$c$ may be less than the magnitude 345 of the first read voltage 340.

In some cases, the pre-read portion 320 may include applying different voltages (e.g., the plurality of voltages 330) to one or more partitions of the memory array. The memory array may include a plurality of partitions where each partition may include the plurality of memory cells (e.g., two or more memory cells). As part of the pre-read portion 320, the memory device may apply a first voltage 335-$a$ to a first partition of the plurality of memory cells and identify a first quantity of memory cells of the first partition in which a snapback event occurs. The memory device may then apply a second voltage 335-$b$ to a second partition of the plurality of memory cells and identify a second quantity of memory cells of the second partition in which the snapback event occurs. The memory device may apply a third voltage 335-$c$ to a third partition of the plurality of memory cells and identify a third quantity of memory cells of the third partition in which the snapback event occurs. Based on the first quantity, the second quantity, and the third quantity of memory cells, the memory device may identify a magnitude 345 or a polarity or both of the first read voltage 340, as described below in further detail.

In some examples, the memory device may apply any quantity of the plurality of voltage 330 to any quantity memory cells or partitions. For example, the memory device may apply different voltages 330 to different partitions of the plurality of memory cells and identify quantities of memory cells in which snapback events occur. In such cases, the memory device may identify the magnitude 345 or a polarity or both of the first read voltage 340 based on the quantities of memory cells. In some cases, the memory device may apply any quantity of the plurality of voltages 330 to a sub-bank or bits of a memory device.

In some examples, the plurality of voltages 330 may be applied to codewords of the partitions. The codewords may be divided into pools of codewords such that each pool of codewords may be read at different voltages 330. Based on applying the plurality of voltages 330 to codewords, the memory device may then identify a likely distribution for one of the logic states in the memory cells. For example, the memory device may combine the pre-read data (e.g., data associated with applying the first voltage 335-$a$, the second voltage 335-$b$, and the third voltage 335-$c$) to determine a shape of the distribution. In such cases, the memory device may aggregate data associated with applying the first voltage 335-$a$ to the first partition, applying the second voltage 335-$b$ to the second partition, and applying the third voltage 335-$c$ to the third partition. The aggregation of pre-read data may improve the efficiency of the memory device by reducing the read latency and selecting the first read voltage based on the pre-read data. In some cases, the memory device may determine a shape of the distribution by identifying one or more likely distributions of threshold voltages associated with memory cells that store a first logic state (e.g., distribution 305).

The shape of the distribution may be determined based on reading the memory cells at different voltages 330 (e.g., first voltage 335-a, the second voltage 335-b, and the third voltage 335-c) and determining a voltage drift associated with each distribution (e.g., distribution 305, 310, and 315). The memory device may ramp different partitions to different voltages 330 and determine an amount of bits thresholding at each of the plurality of voltages 330 (e.g., first voltage 335-a, the second voltage 335-b, and the third voltage 335-c). An increased amount of bits thresholding may increase the accuracy of the determined shape of the distribution. In some cases, determining that the amount of bits thresholding may be above a threshold may identify that a snapback event occurred.

In some cases, a distribution that experiences a low or no voltage drift may be placed at a lower priority level as compared to a distribution that experiences a high of voltage drift. For example, distribution 305 may experience little to no voltage drift while distribution 310 may experience a higher voltage drift as compared to distribution 305. Based on the voltage drift, the first read voltage 340 may be selected between the distribution that experiences the small or no voltage drift and the distribution that experience the high voltage drift. The memory device may rank the distributions and select the highest priority as a starting point for the first read voltage 340.

The timing diagram 360 may include a read portion 325 after the pre-read portion 320. The read portion 325 may include a first read voltage 340 and a second read voltage 350. Using that information associated with the likely distribution and the shape of the distribution, the memory device may select the first read voltage 340 for the read portion 325 of the operation. In some examples, the memory device may count a quantity of set bits in the codeword by pre-reading the set state (e.g., distribution 305). The first read voltage 340 may be determined based on aggregating the pre-read data, identifying the one or more likely distributions of the threshold voltages, or both. In some examples, the magnitude 345 or a polarity or both of the first read voltage 340 may be determined based on the data associated with the pre-read portion 320.

The memory device may apply the first read voltage 340 to a memory cell of the plurality of memory cells to identify a logic state stored by the memory cell as part of the read portion 325 of the read operation. In some cases, the memory device may identify a magnitude 345 of the first read voltage 340 based on applying the plurality of voltages 330. The memory device may also determine a polarity of the first read voltage 340. For example, the memory device may determine that the polarity of the first read voltage 340 is a positive polarity.

In some cases, the first read voltage 340 may be between a voltage associated with the distribution 305 and a voltage associated with the distribution 310. In such cases, the memory device may determine that the first read voltage 340 is between a voltage of a first type of state (e.g., distribution 305) and between a voltage of a second type of state (e.g., distribution 310). The first type of state may be capable of being stored by the memory cell that is disturbed after a snapback event occurs. The second type of state may be capable of being stored by the memory cell that is reinforced after the snapback event occurs. In some examples, the memory device may read the logic state associated with the distribution 305 based on applying the first read voltage 340.

A read disturbance may be induced after the application of the first read voltage 340. In such cases, a write-back operation may be performed on the memory cell to reduce the read disturbance on an intermediate state of the memory cell (e.g., distribution 310). The memory device may detect the intermediate state associated with distribution 310 and determine whether a first snapback event occurred based on applying the first read voltage 340. The memory device may then perform a reprogram operation on the memory cell after determining the logic state stored by the memory cell is an intermediate state and determining that the first snapback event occurred. In some examples, the memory device may determine that the logic state associated with the distribution 315 failed to experience a snapback event, thereby avoiding a read disturbance on the distribution 315.

In some examples, the memory device may identify a voltage drift from applying the first read voltage 340. In such cases, the memory device may select a second read voltage 350 to apply to the memory cell. For example, the memory device may select the second read voltage 350 based on an offset (e.g., a preconfigured or predetermined offset) between the first read voltage 340 and the second read voltage 350. In such cases, the memory device may identify an offset between the magnitude 345 of the first read voltage 340 and a magnitude 355 of the second read voltage 350. Such an offset may be used because, in some cases, changes in the distribution of voltage thresholds of the first logic state may be similar to changes in the distributions of other voltage thresholds of other logic states.

In some cases, the memory device may determine that an amount of voltage drift for the distribution 305 may be the same as an amount of voltage drift for the distribution 310. In such cases, the memory device may select the second read voltage 350 based on the constant offset (e.g., the amount of voltage drift). The voltage drift of distribution 315 may be greater than the voltage drift of distributions 310 and 305. In such cases, the sense window of distribution 315 may increase. The memory device may determine the magnitude 355 of the second read voltage 350 based on determining the magnitude 345 of the first read voltage, determining the offset, or both. For example, the magnitude 355 of the second read voltage 350 may be greater than the magnitude 345 of the first read voltage 340.

After applying the first read voltage 340, the memory device may apply the second read voltage 350 to the memory cell of the plurality of memory cells as part of the read portion 325 of the read operation. The second read voltage 350 may be between a voltage associated with the distribution 310 and a voltage associated with the distribution 315. In such cases, the memory device may determine that the second read voltage 350 is between a voltage of the second type of state (e.g., distribution 310) and a voltage of a third type of state (e.g., distribution 315). The second type may be capable of being stored by the memory cell that is reinforced after a snapback event occurs. The third type may be capable of being stored by the memory cell that is disturbed after the snapback event occurs.

In some cases, the memory device may determine a polarity of the second read voltage 350. For example, the memory device may determine that the polarity of the second read voltage 350 is a positive polarity. In such cases, the polarity of the second read voltage 350 is the same as the polarity of the first read voltage 340. In some cases, applying the second read voltage 350 may be based on the determining the second read voltage 350, identifying the polarity of the second read voltage 350, identifying the magnitude 355 of the second read voltage 350, or a combination thereof. In some examples, applying the second read voltage 350 may be based on determining that the first snapback event failed to occur.

The performance of the memory cell may increase by applying two read voltages with a same polarity, thereby preventing the memory device from changing the polarity of the read voltage during the read portion 325. Changing polarities of voltages during a read operation may increase a duration of the read operation or may increase a power consumed by the read operation or both. In some cases, including, in the read operation, a pre-read portion 320 that identifies the first read voltage 340 of the read portion 325 may increase an amount of bits accessed per memory cell, reduce a size of the memory die, and decrease a density of the memory array, thereby reducing power consumption and increasing read, write, and erase operations of the memory device.

In some examples, devices, systems, and techniques are described for accessing a multi-level self-selecting memory cell that stores more than three states. As described with reference to FIG. 3B, the memory device may select the second read voltage 350 to distinguish between storing the second logic state and a third logic state based on the first read voltage 340. In some cases, the memory device may select a third read voltage to distinguish between storing the third logic state and a fourth logic state based on the second read voltage 350. In other examples, the memory device may select a fourth read voltage to distinguish between storing the fourth logic state and a fifth logic state based on the third read voltage. In such cases, the memory device may determine the fourth or fifth logic state based on applying the third read voltage and the fourth read voltage.

Figure 4A:
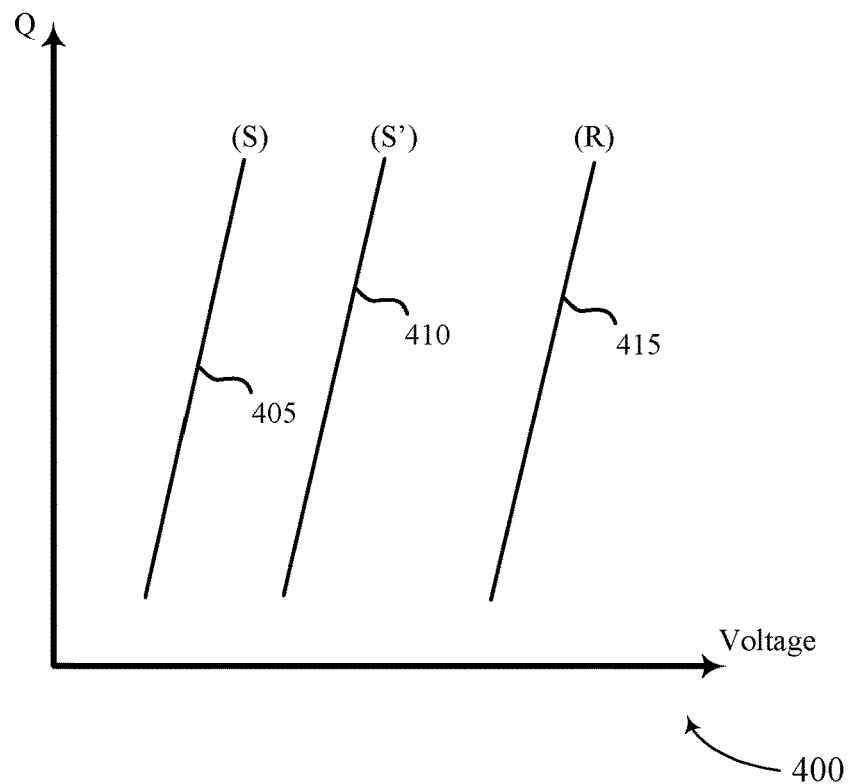
FIG. 4A illustrates an example of a diagram showing distributions of threshold voltages in a self-selecting memory cell that supports accessing a multi-level memory cell in accordance with examples as disclosed herein.

FIG. 4A illustrates an example of a diagram 400 showing distributions of threshold voltages of a self-selecting memory cell that supports that supports accessing a multi-level memory cell in accordance with examples as disclosed herein. Diagram 400 may be an example of diagram 300 described with reference to FIG. 3A. In some cases, the diagram 400 may include distributions that represent more than three logic states. For example, the diagram 400 may include distributions that represent a fourth logic state, a fifth logic state, or more logic states.

Figure 4B:
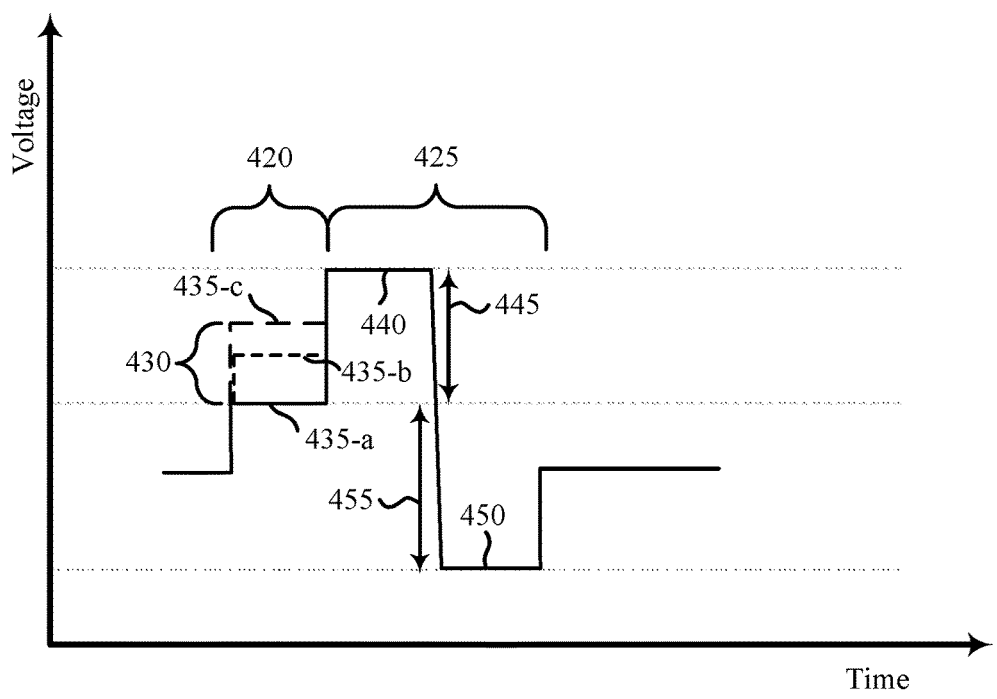
FIG. 4B illustrates an example of a timing diagram that supports accessing a multi-level memory cell in accordance with examples as disclosed herein.

FIG. 4B illustrates an example of a timing diagram 460 that supports accessing a multi-level memory cell in accordance with examples as disclosed herein. The timing diagram 460 may include a pre-read portion 420 and a read portion 425. The timing diagram 460 may plot a magnitude of the voltage of one or more pulses (y-axis) applied to the memory cell with respect to time (x-axis).

The pre-read portion 420 and the plurality of voltages 430 including the first voltage 435-a, second voltage 435-b, and third voltage 435-c may each be an example of pre-read portion 320, plurality of voltages 330, first voltage 335-a, second voltage 335-b, and third voltage 335-c, respectively, described with reference to FIG. 3B. The operations performed by the memory device and associated with the pre-read portion 420 may be examples of the operations performed by the memory device and associated with the pre-read portion 320 described with reference to FIG. 3B. The first read voltage 440 having a magnitude 445 may be examples of the first read voltage 340 having the magnitude 345 described with reference to FIG. 3B.

In some cases, the memory device may determine a polarity of the second read voltage 450. For example, the memory device may determine that the polarity of the second read voltage 450 is a negative polarity. In such cases, the polarity of the second read voltage 450 is different than polarity of the first read voltage 440. The memory device may apply the second read voltage 450 with a second polarity to the memory cell as part of the read portion 425 of the read operation.

The memory device may determine that a snapback event occurred at the set state associated with the distribution 405. In such cases, the memory device may flip the polarity of the reset state associated with the distribution 415 and determine that a snapback event occurred at the reset state. In such cases, the set state and reset states may be reinforced after the snapback event occurs (e.g., the memory cell may be refreshed after determining that the snapback event occurs). The polarity of the first read voltage 440 may be selected to reinforce the set state (e.g., associated with distribution 405), and the polarity of the second read voltage 450 may be selected to reinforce the reset state (e.g., associated with distribution 415).

The intermediate state associated with the distribution 410 may remain undisturbed, thereby reducing an amount of write-back operations performed on the intermediate state as compared to the amount of write-back operations described with reference to FIG. 3B. The memory device may determine that a snapback event failed to occur for the intermediate state. In such cases, the memory device may determine a voltage drift associated with the intermediate state based on a lack of snapback events and a lack of refresh operations. The read operation according to timing diagram 460 may be selected to reduce read disturbance, while the read operation according to timing diagram 360 may be selected to reduce voltage drift.

The memory device may change the polarity of the second read voltage 450 (e.g., to be opposite the polarity of the first read voltage 440) during the read portion 425, by applying two sequential read voltages with opposite polarities. In some examples, the difference in polarities between the first read voltage 440 and the second read voltage 450 may reduce an amount of write-back operations performed on the intermediate state (e.g., distribution 410). In some cases, no write-back operations may be performed on the intermediate state based on using sequential read voltages of opposite polarity. In such cases, the memory device may not disturb the intermediate state in the positive polarity or the negative polarity, thereby decreasing the power consumption and improving the efficiency of the read operation as compared to the read operation described with reference to FIG. 3B. Because the intermediate state is not disturbed by the first read voltage or the second read voltage, a write-back operation for the intermediate state may not be used, thereby reducing the duration of the read operation and the power consumption.

In some examples, devices, systems, and techniques are described for accessing a multi-level self-selecting memory cell that stores more than three states. As described with reference to FIG. 4B, the memory device may select the second read voltage 450 to distinguish between storing the second logic state and a third logic state based on the first read voltage 440. In some cases, the memory device may select a third read voltage to distinguish between storing the third logic state and a fourth logic state based on the second read voltage 450. In other examples, the memory device may select a fourth read voltage to distinguish between storing the fourth logic state and a fifth logic state based on the third read voltage. In such cases, the memory device may determine the fourth or fifth logic state based on applying the third read voltage and the fourth read voltage.

Figure 5:
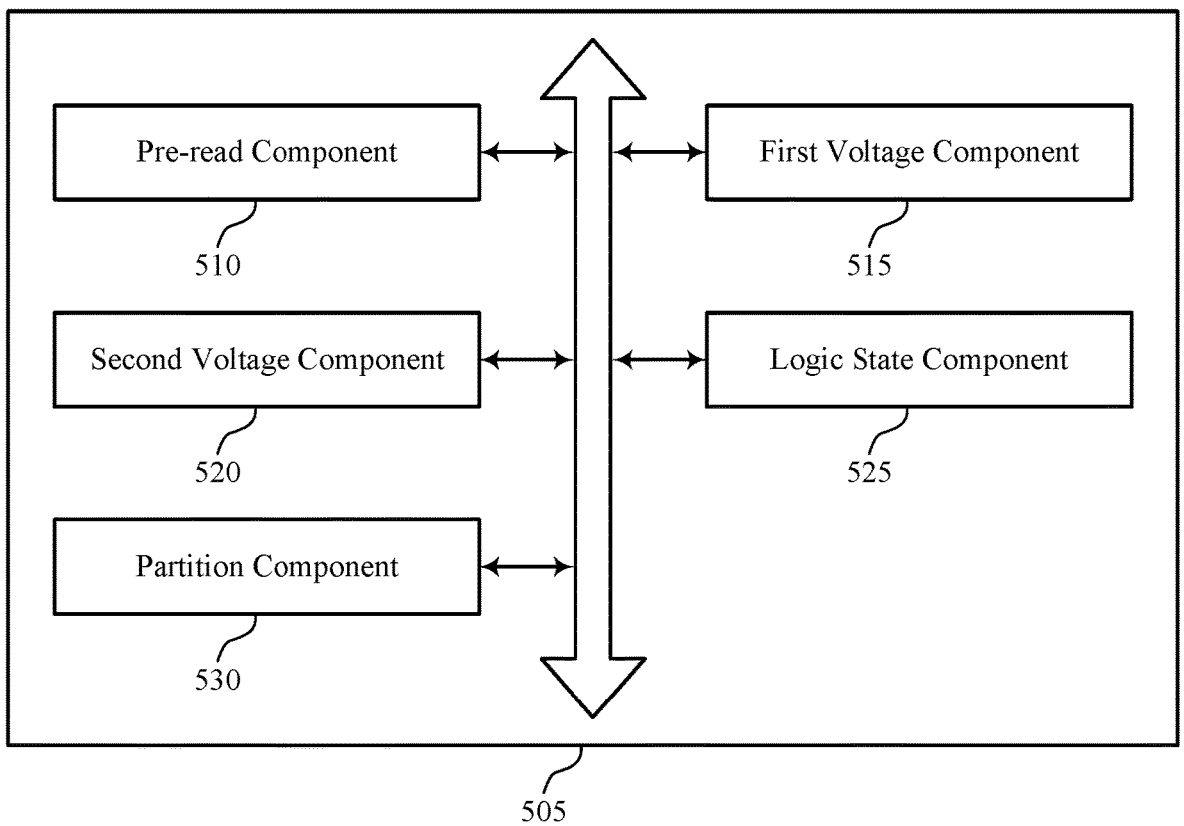
FIG. 5 shows a block diagram of a memory device that supports accessing a multi-level memory cell in accordance with examples as disclosed herein.

FIG. 5 shows a block diagram 500 of a memory device 505 that supports accessing a multi-level memory cell in accordance with examples as disclosed herein. The memory device 505 may be an example of aspects of a memory device as described with reference to FIGS. 1 through 4. The memory device 505 may include a pre-read component 510, a first voltage component 515, a second voltage component 520, a logic state component 525, and a partition component 530. Each of these modules may communicate, directly or indirectly, with one another (e.g., via one or more buses).

The pre-read component 510 may apply a set of voltages to a set of memory cells as part of a pre-read portion of a read operation. In some examples, the pre-read component 510 may apply a first voltage to a first partition of the set of memory cells. In some examples, the pre-read component 510 may apply a second voltage to a second partition of the set of memory cells.

In some examples, the pre-read component 510 may identify a magnitude or a polarity or both of the first read voltage based on the first quantity and the second quantity. In some examples, the pre-read component 510 may aggregate data associated with applying the first voltage to the first partition and applying the second voltage to the second partition, where identifying a first magnitude of the first read voltage is based on aggregating the data.

In some examples, the pre-read component 510 may identify one or more likely distributions of threshold voltages associated with memory cells that store a first logic state based on the first quantity and the second quantity, where identifying the magnitude or the polarity or both of the first read voltage is based on identifying the one or more likely distributions of threshold voltages. In some examples, the pre-read component 510 may apply different voltages to different partitions of the set of memory cells. In some examples, the pre-read component 510 may identify a magnitude or a polarity or both of the first read voltage based on the quantities of memory cells.

The first voltage component 515 may apply a first read voltage to a memory cell of the set of memory cells to identify a logic state stored by the memory cell as part of a read portion of the read operation based on applying the set of voltages. In some examples, the first voltage component 515 may apply a first read voltage with a first magnitude and a first polarity to a memory cell of the set of memory cells to identify a logic state stored by the memory cell as part of a read portion of the read operation based on applying the set of voltages. In some examples, the first voltage component 515 may apply a first read voltage with a first polarity to a memory cell of the set of memory cells to identify a logic state stored by the memory cell as part of a read portion of the read operation based on applying the set of voltages.

In some examples, the first voltage component 515 may identify a first magnitude of the first read voltage based on applying the set of voltages, where applying the first read voltage is based on identifying the first magnitude of the first read voltage. In some examples, the first voltage component 515 may determine that the first read voltage is between a voltage of a first type of state capable of being stored by the memory cell that is disturbed after a snapback event occurs and a voltage of a second type of state capable of being stored by the memory cell that is reinforced after the snapback event occurs, where applying the first read voltage is based on the determining.

In some examples, the first voltage component 515 may identify a polarity of the first read voltage, where applying the first read voltage is based on identifying the polarity of the first read voltage. In some examples, the first voltage component 515 may identify the first polarity of the first read voltage and the second read voltage, where applying the first read voltage and applying the second read voltage is based on identifying the first polarity, where the first polarity is a positive polarity. In some examples, the first voltage component 515 may identify the first polarity of the first read voltage, where applying the first read voltage is based on identifying the first polarity of the first read voltage.

The second voltage component 520 may apply a second read voltage to the memory cell of the set of memory cells as part of the read portion of the read operation based on applying the first read voltage. In some examples, the second voltage component 520 may apply a second read voltage with a second magnitude and the first polarity to the memory cell as part of the read portion of the read operation based on applying the first read voltage. In some examples, the second voltage component 520 may apply a second read voltage with a second polarity to the memory cell as part of the read portion of the read operation based on applying the first read voltage.

In some examples, the second voltage component 520 may identify a second magnitude of the second read voltage based on identifying the first magnitude of the first read voltage, where applying the second read voltage is based on identifying the first magnitude of the second read voltage. In some examples, the second voltage component 520 may identify the second magnitude of the second read voltage based on identifying the first magnitude of the first read voltage, where applying the second read voltage is based on identifying the first magnitude of the second read voltage, where the first magnitude is less than the second magnitude. In some examples, the second voltage component 520 may identify a second magnitude of the second read voltage based on identifying the first magnitude of the first read voltage, where applying the second read voltage is based on identifying the first magnitude of the second read voltage, where the first magnitude is equal to the second magnitude.

In some examples, the second voltage component 520 may identify an offset between the first magnitude of the first read voltage and the second magnitude of the second read voltage, where identifying the second magnitude of the second read voltage is based on the offset and the first magnitude. In some examples, the second voltage component 520 may determine that the second read voltage is between a voltage of a second type of state capable of being stored by the memory cell that is reinforced after a snapback event occurs and a voltage of a third type of state capable of being stored by the memory cell that is disturbed after the snapback event occurs, where applying the second read voltage is based on the determining.

In some examples, the second voltage component 520 may identify a polarity of the second read voltage, where applying the second read voltage is based on identifying the polarity of the second read voltage. In some examples, the second voltage component 520 may identify the second polarity of the second read voltage, where applying the second read voltage is based on identifying the second polarity of the second read voltage, where the first polarity is a positive polarity and the second polarity is a negative polarity.

The logic state component 525 may determine the logic state stored by the memory cell based on applying the first read voltage and applying the second read voltage. In some examples, the logic state component 525 may determine whether a first snapback event occurred based on applying the first read voltage, where applying the second read voltage is based on determining that the first snapback event failed to occur. In some examples, the logic state component 525 may perform a reprogram operation on the memory cell after determining the logic state stored by the memory cell based on determining that the first snapback event occurred.

The partition component 530 may identify a first quantity of memory cells of the first partition in which a snapback event occurs based on applying the first voltage. In some examples, the partition component 530 may identify a second quantity of memory cells of the second partition in which the snapback event occurs based on applying the second voltage. In some examples, the partition component 530 may identify quantities of memory cells in which snapback events occur based on applying the different voltages.

Figure 6:
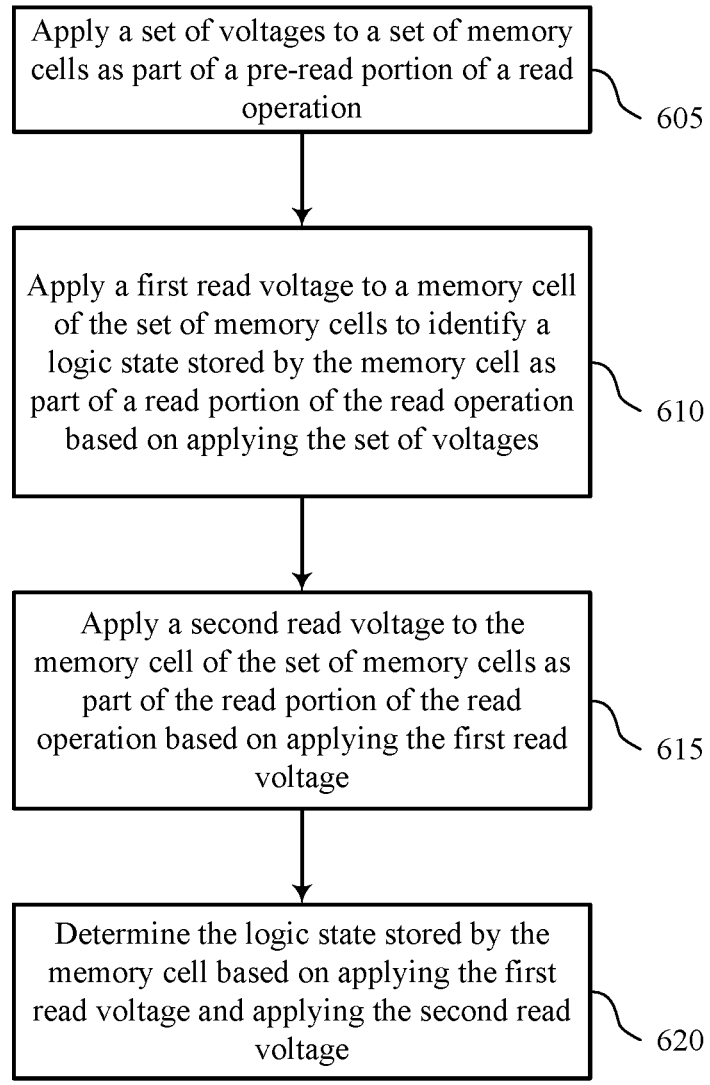
FIGS. 6 through 8 show flowcharts illustrating a method or methods that support accessing a multi-level memory cell in accordance with examples as disclosed herein.

FIG. 6 shows a flowchart illustrating a method or methods 600 that supports accessing a multi-level memory cell in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may apply a set of voltages to a set of memory cells as part of a pre-read portion of a read operation. The operations of 605 may be performed according to the methods described herein. In some examples, aspects of the operations of 605 may be performed by a pre-read component as described with reference to FIG. 5.

At 610, the memory device may apply a first read voltage to a memory cell of the set of memory cells to identify a logic state stored by the memory cell as part of a read portion of the read operation based on applying the set of voltages. The operations of 610 may be performed according to the methods described herein. In some examples, aspects of the operations of 610 may be performed by a first voltage component as described with reference to FIG. 5.

At 615, the memory device may apply a second read voltage to the memory cell of the set of memory cells as part of the read portion of the read operation based on applying the first read voltage. The operations of 615 may be performed according to the methods described herein. In some examples, aspects of the operations of 615 may be performed by a second voltage component as described with reference to FIG. 5.

At 620, the memory device may determine the logic state stored by the memory cell based on applying the first read voltage and applying the second read voltage. The operations of 620 may be performed according to the methods described herein. In some examples, aspects of the operations of 620 may be performed by a logic state component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for applying a set of voltages to a set of memory cells as part of a pre-read portion of a read operation, applying a first read voltage to a memory cell of the set of memory cells to identify a logic state stored by the memory cell as part of a read portion of the read operation based on applying the set of voltages, applying a second read voltage to the memory cell of the set of memory cells as part of the read portion of the read operation based on applying the first read voltage, and determining the logic state stored by the memory cell based on applying the first read voltage and applying the second read voltage.

Some examples of the method 600 and the apparatus described herein may further include operations, features, means, or instructions for identifying a first magnitude of the first read voltage based on applying the set of voltages, where applying the first read voltage may be based on identifying the first magnitude of the first read voltage.

Some examples of the method 600 and the apparatus described herein may further include operations, features, means, or instructions for identifying a second magnitude of the second read voltage based on identifying the first magnitude of the first read voltage, where applying the second read voltage may be based on identifying the first magnitude of the second read voltage.

Some examples of the method 600 and the apparatus described herein may further include operations, features, means, or instructions for identifying an offset between the first magnitude of the first read voltage and the second magnitude of the second read voltage, where identifying the second magnitude of the second read voltage may be based on the offset and the first magnitude.

In some examples of the method 600 and the apparatus described herein, applying the set of voltages further may include operations, features, means, or instructions for applying a first voltage to a first partition of the set of memory cells, identifying a first quantity of memory cells of the first partition in which a snapback event occurs based on applying the first voltage, applying a second voltage to a second partition of the set of memory cells, identifying a second quantity of memory cells of the second partition in which the snapback event occurs based on applying the second voltage, and identifying a magnitude or a polarity or both of the first read voltage based on the first quantity and the second quantity.

Some examples of the method 600 and the apparatus described herein may further include operations, features, means, or instructions for aggregating data associated with applying the first voltage to the first partition and applying the second voltage to the second partition, where identifying a first magnitude of the first read voltage may be based on aggregating the data.

Some examples of the method 600 and the apparatus described herein may further include operations, features, means, or instructions for identifying one or more likely distributions of threshold voltages associated with memory cells that store a first logic state based on the first quantity and the second quantity, where identifying the magnitude or the polarity or both of the first read voltage may be based on identifying the one or more likely distributions of threshold voltages.

In some examples of the method 600 and the apparatus described herein, the first partition and the second partition each include two or more memory cells of the set of memory cells.

Some examples of the method 600 and the apparatus described herein may further include operations, features, means, or instructions for determining that the first read voltage may be between a voltage of a first type of state capable of being stored by the memory cell that may be disturbed after a snapback event occurs and a voltage of a second type of state capable of being stored by the memory cell that may be reinforced after the snapback event occurs, where applying the first read voltage may be based on the determining.

Some examples of the method 600 and the apparatus described herein may further include operations, features, means, or instructions for determining that the second read voltage may be between a voltage of a second type of state capable of being stored by the memory cell that may be reinforced after a snapback event occurs and a voltage of a third type of state capable of being stored by the memory cell that may be disturbed after the snapback event occurs, where applying the second read voltage may be based on the determining.

Some examples of the method 600 and the apparatus described herein may further include operations, features, means, or instructions for identifying a polarity of the first read voltage, where applying the first read voltage may be based on identifying the polarity of the first read voltage, and identifying a polarity of the second read voltage, where applying the second read voltage may be based on identifying the polarity of the second read voltage.

In some examples of the method 600 and the apparatus described herein, the polarity of the first read voltage may be the same as the polarity of the second read voltage.

In some examples of the method 600 and the apparatus described herein, the polarity of the first read voltage may be different than the polarity of the second read voltage.

In some examples of the method 600 and the apparatus described herein, applying the set of voltages further may include operations, features, means, or instructions for applying different voltages to different partitions of the set of memory cells, identifying quantities of memory cells in which snapback events occur based on applying the different voltages, and identifying a magnitude or a polarity or both of the first read voltage based on the quantities of memory cells.

Some examples of the method 600 and the apparatus described herein may further include operations, features, means, or instructions for determining whether a first snapback event occurred based on applying the first read voltage, where applying the second read voltage may be based on determining that the first snapback event failed to occur.

Some examples of the method 600 and the apparatus described herein may further include operations, features, means, or instructions for performing a reprogram operation on the memory cell after determining the logic state stored by the memory cell based on determining that the first snapback event occurred.

Figure 7:
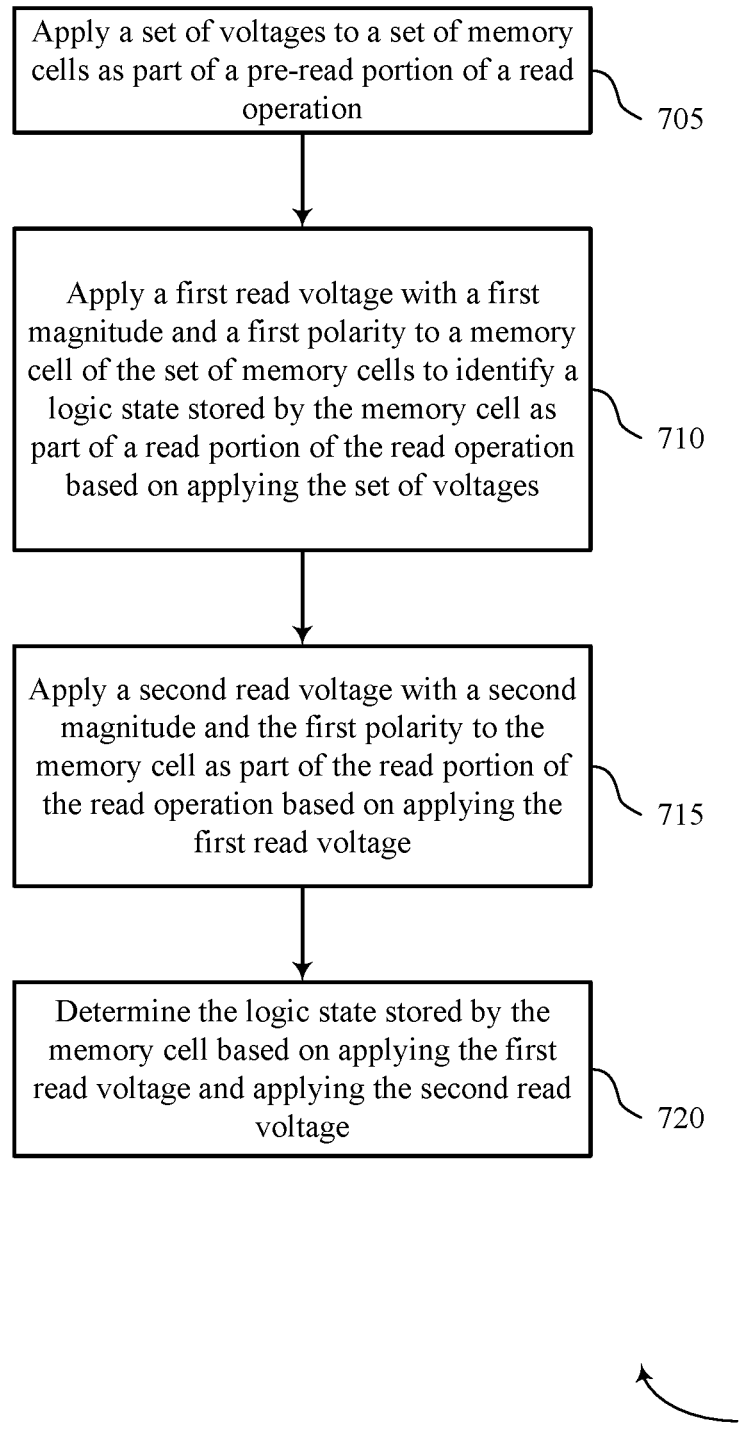

FIG. 7 shows a flowchart illustrating a method or methods 700 that supports accessing a multi-level memory cell in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may apply a set of voltages to a set of memory cells as part of a pre-read portion of a read operation. The operations of 705 may be performed according to the methods described herein. In some examples, aspects of the operations of 705 may be performed by a pre-read component as described with reference to FIG. 5.

At 710, the memory device may apply a first read voltage with a first magnitude and a first polarity to a memory cell of the set of memory cells to identify a logic state stored by the memory cell as part of a read portion of the read operation based on applying the set of voltages. The operations of 710 may be performed according to the methods described herein. In some examples, aspects of the operations of 710 may be performed by a first voltage component as described with reference to FIG. 5.

At 715, the memory device may apply a second read voltage with a second magnitude and the first polarity to the memory cell as part of the read portion of the read operation based on applying the first read voltage. The operations of 715 may be performed according to the methods described herein. In some examples, aspects of the operations of 715 may be performed by a second voltage component as described with reference to FIG. 5.

At 720, the memory device may determine the logic state stored by the memory cell based on applying the first read voltage and applying the second read voltage. The operations of 720 may be performed according to the methods described herein. In some examples, aspects of the operations of 720 may be performed by a logic state component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for applying a set of voltages to a set of memory cells as part of a pre-read portion of a read operation, applying a first read voltage with a first magnitude and a first polarity to a memory cell of the set of memory cells to identify a logic state stored by the memory cell as part of a read portion of the read operation based on applying the set of voltages, applying a second read voltage with a second magnitude and the first polarity to the memory cell as part of the read portion of the read operation based on applying the first read voltage, and determining the logic state stored by the memory cell based on applying the first read voltage and applying the second read voltage.

Some examples of the method 700 and the apparatus described herein may further include operations, features, means, or instructions for identifying the first magnitude of the first read voltage based on applying the set of voltages, where applying the first read voltage may be based on identifying the first magnitude of the first read voltage.

Some examples of the method 700 and the apparatus described herein may further include operations, features, means, or instructions for identifying the second magnitude of the second read voltage based on identifying the first magnitude of the first read voltage, where applying the second read voltage may be based on identifying the first magnitude of the second read voltage, where the first magnitude may be less than the second magnitude.

Some examples of the method 700 and the apparatus described herein may further include operations, features, means, or instructions for identifying an offset between the first magnitude of the first read voltage and the second magnitude of the second read voltage, where identifying the second magnitude of the second read voltage may be based on the offset and the first magnitude.

In some examples of the method 700 and the apparatus described herein, applying the set of voltages further may include operations, features, means, or instructions for applying a first voltage to a first partition of the set of memory cells, identifying a first quantity of memory cells of the first partition in which a snapback event occurs based on applying the first voltage, applying a second voltage to a second partition of the set of memory cells, identifying a second quantity of memory cells of the second partition in which the snapback event occurs based on applying the second voltage, and identifying a magnitude or a polarity or both of the first read voltage based on the first quantity and the second quantity.

Some examples of the method 700 and the apparatus described herein may further include operations, features, means, or instructions for identifying the first polarity of the first read voltage and the second read voltage, where applying the first read voltage and applying the second read voltage may be based on identifying the first polarity, where the first polarity may be a positive polarity.

Figure 8:
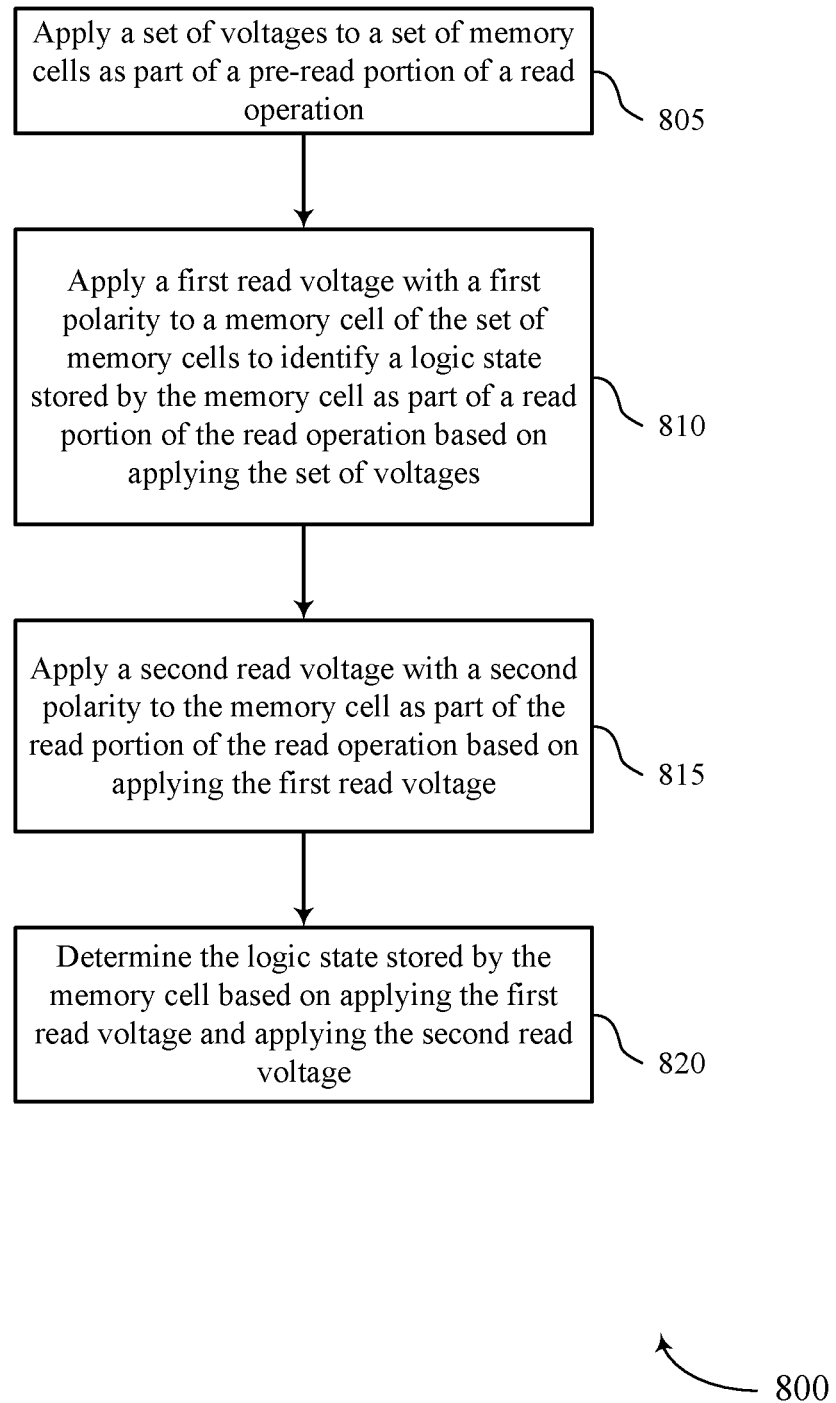

FIG. 8 shows a flowchart illustrating a method or methods 800 that supports accessing a multi-level memory cell in accordance with examples as disclosed herein. The operations of method 800 may be implemented by a memory device or its components as described herein. For example, the operations of method 800 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 805, the memory device may apply a set of voltages to a set of memory cells as part of a pre-read portion of a read operation. The operations of 805 may be performed according to the methods described herein. In some examples, aspects of the operations of 805 may be performed by a pre-read component as described with reference to FIG. 5.

At 810, the memory device may apply a first read voltage with a first polarity to a memory cell of the set of memory cells to identify a logic state stored by the memory cell as part of a read portion of the read operation based on applying the set of voltages. The operations of 810 may be performed according to the methods described herein. In some examples, aspects of the operations of 810 may be performed by a first voltage component as described with reference to FIG. 5.

At 815, the memory device may apply a second read voltage with a second polarity to the memory cell as part of the read portion of the read operation based on applying the first read voltage. The operations of 815 may be performed according to the methods described herein. In some examples, aspects of the operations of 815 may be performed by a second voltage component as described with reference to FIG. 5.

At 820, the memory device may determine the logic state stored by the memory cell based on applying the first read voltage and applying the second read voltage. The operations of 820 may be performed according to the methods described herein. In some examples, aspects of the operations of 820 may be performed by a logic state component as described with reference to FIG. 5.

In some examples, an apparatus as described herein may perform a method or methods, such as the method 800. The apparatus may include features, means, or instructions (e.g., a non-transitory computer-readable medium storing instructions executable by a processor) for applying a set of voltages to a set of memory cells as part of a pre-read portion of a read operation, applying a first read voltage with a first polarity to a memory cell of the set of memory cells to identify a logic state stored by the memory cell as part of a read portion of the read operation based on applying the set of voltages, applying a second read voltage with a second polarity to the memory cell as part of the read portion of the read operation based on applying the first read voltage, and determining the logic state stored by the memory cell based on applying the first read voltage and applying the second read voltage.

Some examples of the method 800 and the apparatus described herein may further include operations, features, means, or instructions for identifying a first magnitude of the first read voltage based on applying the set of voltages, where applying the first read voltage may be based on identifying the first magnitude of the first read voltage.

Some examples of the method 800 and the apparatus described herein may further include operations, features, means, or instructions for identifying a second magnitude of the second read voltage based on identifying the first magnitude of the first read voltage, where applying the second read voltage may be based on identifying the first magnitude of the second read voltage, where the first magnitude may be equal to the second magnitude.

Some examples of the method 800 and the apparatus described herein may further include operations, features, means, or instructions for identifying an offset between the first magnitude of the first read voltage and the second magnitude of the second read voltage, where identifying the second magnitude of the second read voltage may be based on the offset and the first magnitude.

In some examples of the method 800 and the apparatus described herein, applying the set of voltages further may include operations, features, means, or instructions for applying a first voltage to a first partition of the set of memory cells, identifying a first quantity of memory cells of the first partition in which a snapback event occurs based on applying the first voltage, applying a second voltage to a second partition of the set of memory cells, identifying a second quantity of memory cells of the second partition in which the snapback event occurs based on applying the second voltage, and identifying a magnitude or a polarity or both of the first read voltage based on the first quantity and the second quantity.

Some examples of the method 800 and the apparatus described herein may further include operations, features, means, or instructions for identifying the first polarity of the first read voltage, where applying the first read voltage may be based on identifying the first polarity of the first read voltage, and identifying the second polarity of the second read voltage, where applying the second read voltage may be based on identifying the second polarity of the second read voltage, where the first polarity may be a positive polarity and the second polarity may be a negative polarity.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array comprising a set of memory cells and a control component coupled with the memory array, the control component configured to cause the apparatus to apply a set of voltages to a set of memory cells as part of a pre-read portion of a read operation, apply a first read voltage to a memory cell of the set of memory cells to identify a logic state stored by the memory cell as part of a read portion of the read operation based on applying the set of voltages, apply a second read voltage to the memory cell of the set of memory cells as part of the read portion of the read operation based on applying the first read voltage, and determine the logic state stored by the memory cell based on applying the first read voltage and applying the second read voltage.

Some examples may further include identifying a first magnitude of the first read voltage based on applying the set of voltages, where applying the first read voltage may be based on identifying the first magnitude of the first read voltage.

Some examples may further include identifying a second magnitude of the second read voltage based on identifying the first magnitude of the first read voltage, where applying the second read voltage may be based on identifying the first magnitude of the second read voltage.

Some examples may further include identifying an offset between the first magnitude of the first read voltage and the second magnitude of the second read voltage, where identifying the second magnitude of the second read voltage may be based on the offset and the first magnitude.

Some examples may further include applying a first voltage to a first partition of the set of memory cells, identifying a first quantity of memory cells of the first partition in which a snapback event occurs based on applying the first voltage, apply a second voltage to a second partition of the set of memory cells, identifying a second quantity of memory cells of the second partition in which the snapback event occurs based on applying the second voltage, and identifying a magnitude or a polarity or both of the first read voltage based on the first quantity and the second quantity.

Some examples may further include aggregating data associated with applying the first voltage to the first partition and applying the second voltage to the second partition, where identifying a first magnitude of the first read voltage may be based on aggregating the data.

Some examples may further include identifying one or more likely distributions of threshold voltages associated with memory cells that store a first logic state based on the first quantity and the second quantity, where identifying the magnitude or the polarity or both of the first read voltage may be based on identifying the one or more likely distributions of threshold voltages.

In some examples, the first partition and the second partition each include two or more memory cells of the set of memory cells.

Some examples may further include determining that the first read voltage may be between a voltage of a first type of state capable of being stored by the memory cell that may be disturbed after a snapback event occurs and a voltage of a second type of state capable of being stored by the memory cell that may be reinforced after the snapback event occurs, where applying the first read voltage may be based on the determining.

Some examples may further include determining that the second read voltage may be between a voltage of a second type of state capable of being stored by the memory cell that may be reinforced after a snapback event occurs and a voltage of a third type of state capable of being stored by the memory cell that may be disturbed after the snapback event occurs, where applying the second read voltage may be based on the determining.

Some examples may further include identifying a polarity of the first read voltage, where applying the first read voltage may be based on identifying the polarity of the first read voltage, and identifying a polarity of the second read voltage, where applying the second read voltage may be based on identifying the polarity of the second read voltage.

In some examples, the polarity of the first read voltage may be the same as the polarity of the second read voltage.

In some examples, the polarity of the first read voltage may be different than the polarity of the second read voltage.

Some examples may further include applying different voltages to different partitions of the set of memory cells, identifying quantities of memory cells in which snapback events occur based on applying the different voltages, and identifying a magnitude or a polarity or both of the first read voltage based on the quantities of memory cells.

Some examples may further include determining whether a first snapback event occurred based on applying the first read voltage, where applying the second read voltage may be based on determining that the first snapback event failed to occur.

Some examples may further include performing a reprogram operation on the memory cell after determining the logic state stored by the memory cell based on determining that the first snapback event occurred.

An apparatus is described. The apparatus may include a memory array comprising a set of memory cells and a control component coupled with the memory array, the control component configured to cause the apparatus to apply a set of voltages to a set of memory cells as part of a pre-read portion of a read operation, apply a first read voltage with a first magnitude and a first polarity to a memory cell of the set of memory cells to identify a logic state stored by the memory cell as part of a read portion of the read operation based on applying the set of voltages, apply a second read voltage with a second magnitude and the first polarity to the memory cell as part of the read portion of the read operation based on applying the first read voltage, and determine the logic state stored by the memory cell based on applying the first read voltage and applying the second read voltage.

Some examples may further include identifying the first magnitude of the first read voltage based on applying the set of voltages, where applying the first read voltage may be based on identifying the first magnitude of the first read voltage.

Some examples may further include identifying the second magnitude of the second read voltage based on identifying the first magnitude of the first read voltage, where applying the second read voltage may be based on identifying the first magnitude of the second read voltage, where the first magnitude may be less than the second magnitude.

Some examples may further include identifying an offset between the first magnitude of the first read voltage and the second magnitude of the second read voltage, where identifying the second magnitude of the second read voltage may be based on the offset and the first magnitude.

Some examples may further include applying a first voltage to a first partition of the set of memory cells, identifying a first quantity of memory cells of the first partition in which a snapback event occurs based on applying the first voltage, applying a second voltage to a second partition of the set of memory cells, identify a second quantity of memory cells of the second partition in which the snapback event occurs based on applying the second voltage, and identifying a magnitude or a polarity or both of the first read voltage based on the first quantity and the second quantity.

Some examples may further include identifying the first polarity of the first read voltage and the second read voltage, where applying the first read voltage and applying the second read voltage may be based on identifying the first polarity, where the first polarity may be a positive polarity.

An apparatus is described. The apparatus may include a memory array comprising a set of memory cells and a control component coupled with the memory array, the control component configured to cause the apparatus to apply a set of voltages to a set of memory cells as part of a pre-read portion of a read operation, apply a first read voltage with a first polarity to a memory cell of the set of memory cells to identify a logic state stored by the memory cell as part of a read portion of the read operation based on applying the set of voltages, apply a second read voltage with a second polarity to the memory cell as part of the read portion of the read operation based on applying the first read voltage, and determine the logic state stored by the memory cell based on applying the first read voltage and applying the second read voltage.

Some examples may further include identifying a first magnitude of the first read voltage based on applying the set of voltages, where applying the first read voltage may be based on identifying the first magnitude of the first read voltage.

Some examples may further include identifying a second magnitude of the second read voltage based on identifying the first magnitude of the first read voltage, where applying the second read voltage may be based on identifying the first magnitude of the second read voltage, where the first magnitude may be equal to the second magnitude.

Some examples may further include identifying an offset between the first magnitude of the first read voltage and the second magnitude of the second read voltage, where identifying the second magnitude of the second read voltage may be based on the offset and the first magnitude.

Some examples may further include applying a first voltage to a first partition of the set of memory cells, identify a first quantity of memory cells of the first partition in which a snapback event occurs based on applying the first voltage, applying a second voltage to a second partition of the set of memory cells, identifying a second quantity of memory cells of the second partition in which the snapback event occurs based on applying the second voltage, and identifying a magnitude or a polarity or both of the first read voltage based on the first quantity and the second quantity.

Some examples may further include identifying the first polarity of the first read voltage, where applying the first read voltage may be based on identifying the first polarity of the first read voltage, and identifying the second polarity of the second read voltage, where applying the second read voltage may be based on identifying the second polarity of the second read voltage, where the first polarity may be a positive polarity and the second polarity may be a negative polarity.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

As used herein, the term "electrode" may refer to an electrical conductor, and in some examples, may be employed as an electrical contact to a memory cell or other component of a memory array. An electrode may include a trace, wire, conductive line, conductive material, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
applying a plurality of voltages to a plurality of memory cells as part of a pre-read portion of a read operation;
applying a first read voltage to a memory cell of the plurality of memory cells to identify a logic state stored by the memory cell as part of a read portion of the read operation based at least in part on applying the plurality of voltages;
applying a second read voltage to the memory cell of the plurality of memory cells as part of the read portion of the read operation based at least in part on applying the first read voltage; and
determining the logic state stored by the memory cell based at least in part on applying the first read voltage and applying the second read voltage.

2. The method of claim 1, further comprising:
identifying a first magnitude of the first read voltage based at least in part on applying the plurality of voltages, wherein applying the first read voltage is based at least in part on identifying the first magnitude of the first read voltage.

3. The method of claim 2, further comprising:
identifying a second magnitude of the second read voltage based at least in part on identifying the first magnitude of the first read voltage, wherein applying the second read voltage is based at least in part on identifying the first magnitude of the second read voltage.

4. The method of claim 3, further comprising:
identifying an offset between the first magnitude of the first read voltage and the second magnitude of the second read voltage, wherein identifying the second magnitude of the second read voltage is based at least in part on the offset and the first magnitude.

5. The method of claim 1, wherein applying the plurality of voltages further comprises:

applying a first voltage to a first partition of the plurality of memory cells;
identifying a first quantity of memory cells of the first partition in which a snapback event occurs based at least in part on applying the first voltage;
applying a second voltage to a second partition of the plurality of memory cells;
identifying a second quantity of memory cells of the second partition in which the snapback event occurs based at least in part on applying the second voltage; and
identifying a magnitude or a polarity or both of the first read voltage based at least in part on the first quantity and the second quantity.

6. The method of claim 5, further comprising:
aggregating data associated with applying the first voltage to the first partition and applying the second voltage to the second partition, wherein identifying a first magnitude of the first read voltage is based at least in part on aggregating the data.

7. The method of claim 5, further comprising:
identifying one or more likely distributions of threshold voltages associated with memory cells that store a first logic state based at least in part on the first quantity and the second quantity, wherein identifying the magnitude or the polarity or both of the first read voltage is based at least in part on identifying the one or more likely distributions of threshold voltages.

8. The method of claim 5, wherein the first partition and the second partition each comprise two or more memory cells of the plurality of memory cells.

9. The method of claim 1, further comprising:
determining that the first read voltage is between a voltage of a first type of state capable of being stored by the memory cell that is disturbed after a snapback event occurs and a voltage of a second type of state capable of being stored by the memory cell that is reinforced after the snapback event occurs, wherein applying the first read voltage is based at least in part on the determining.

10. The method of claim 1, further comprising:
determining that the second read voltage is between a voltage of a second type of state capable of being stored by the memory cell that is reinforced after a snapback event occurs and a voltage of a third type of state capable of being stored by the memory cell that is disturbed after the snapback event occurs, wherein applying the second read voltage is based at least in part on the determining.

11. The method of claim 1, further comprising:
identifying a polarity of the first read voltage, wherein applying the first read voltage is based at least in part on identifying the polarity of the first read voltage; and
identifying a polarity of the second read voltage, wherein applying the second read voltage is based at least in part on identifying the polarity of the second read voltage.

12. The method of claim 11, wherein the polarity of the first read voltage is the same as the polarity of the second read voltage.

13. The method of claim 11, wherein the polarity of the first read voltage is different than the polarity of the second read voltage.

14. The method of claim 1, wherein applying the plurality of voltages further comprises:
applying different voltages to different partitions of the plurality of memory cells;
identifying quantities of memory cells in which snapback events occur based at least in part on applying the different voltages; and
identifying a magnitude or a polarity or both of the first read voltage based at least in part on the quantities of memory cells.

15. The method of claim 1, further comprising:
determining whether a first snapback event occurred based at least in part on applying the first read voltage, wherein applying the second read voltage is based at least in part on determining that the first snapback event failed to occur.

16. The method of claim 15, further comprising:
performing a reprogram operation on the memory cell after determining the logic state stored by the memory cell based at least in part on determining that the first snapback event occurred.

17. A method, comprising:
applying a plurality of voltages to a plurality of memory cells as part of a pre-read portion of a read operation;
applying a first read voltage with a first magnitude and a first polarity to a memory cell of the plurality of memory cells to identify a logic state stored by the memory cell as part of a read portion of the read operation based at least in part on applying the plurality of voltages;
applying a second read voltage with a second magnitude and the first polarity to the memory cell as part of the read portion of the read operation based at least in part on applying the first read voltage; and
determining the logic state stored by the memory cell based at least in part on applying the first read voltage and applying the second read voltage.

18. The method of claim 17, further comprising:
identifying the first magnitude of the first read voltage based at least in part on applying the plurality of voltages, wherein applying the first read voltage is based at least in part on identifying the first magnitude of the first read voltage.

19. The method of claim 18, further comprising:
identifying the second magnitude of the second read voltage based at least in part on identifying the first magnitude of the first read voltage, wherein applying the second read voltage is based at least in part on identifying the first magnitude of the first read voltage, wherein the first magnitude is less than the second magnitude.

20. The method of claim 18, further comprising:
identifying an offset between the first magnitude of the first read voltage and the second magnitude of the second read voltage, wherein identifying the second magnitude of the second read voltage is based at least in part on the offset and the first magnitude.

21. The method of claim 17, wherein applying the plurality of voltages further comprises:
applying a first voltage to a first partition of the plurality of memory cells;
identifying a first quantity of memory cells of the first partition in which a snapback event occurs based at least in part on applying the first voltage;
applying a second voltage to a second partition of the plurality of memory cells;
identifying a second quantity of memory cells of the second partition in which the snapback event occurs based at least in part on applying the second voltage; and identifying a magnitude or a polarity or both of the first read voltage based at least in part on the first quantity and the second quantity.

22. The method of claim 17, further comprising:
identifying the first polarity of the first read voltage and the second read voltage, wherein applying the first read voltage and applying the second read voltage is based at least in part on identifying the first polarity, wherein the first polarity is a positive polarity.

23. A method, comprising:
applying a plurality of voltages to a plurality of memory cells as part of a pre-read portion of a read operation;
applying a first read voltage with a first polarity to a memory cell of the plurality of memory cells to identify a logic state stored by the memory cell as part of a read portion of the read operation based at least in part on applying the plurality of voltages;
applying a second read voltage with a second polarity to the memory cell as part of the read portion of the read operation based at least in part on applying the first read voltage; and
determining the logic state stored by the memory cell based at least in part on applying the first read voltage and applying the second read voltage.

24. The method of claim 23, further comprising:
identifying a first magnitude of the first read voltage based at least in part on applying the plurality of voltages, wherein applying the first read voltage is based at least in part on identifying the first magnitude of the first read voltage.

25. The method of claim 24, further comprising:
identifying a second magnitude of the second read voltage based at least in part on identifying the first magnitude of the first read voltage, wherein applying the second read voltage is based at least in part on identifying the first magnitude of the first read voltage, wherein the first magnitude is equal to the second magnitude.

26. The method of claim 25, further comprising:
identifying an offset between the first magnitude of the first read voltage and the second magnitude of the second read voltage, wherein identifying the second magnitude of the second read voltage is based at least in part on the offset and the first magnitude.

27. The method of claim 23, wherein applying the plurality of voltages further comprises:
applying a first voltage to a first partition of the plurality of memory cells;
identifying a first quantity of memory cells of the first partition in which a snapback event occurs based at least in part on applying the first voltage;
applying a second voltage to a second partition of the plurality of memory cells;
identifying a second quantity of memory cells of the second partition in which the snapback event occurs based at least in part on applying the second voltage; and
identifying a magnitude or a polarity or both of the first read voltage based at least in part on the first quantity and the second quantity.

28. The method of claim 23, further comprising:
identifying the first polarity of the first read voltage, wherein applying the first read voltage is based at least in part on identifying the first polarity of the first read voltage; and
identifying the second polarity of the second read voltage, wherein applying the second read voltage is based at least in part on identifying the second polarity of the second read voltage, wherein the first polarity is a positive polarity and the second polarity is a negative polarity.

29. An apparatus comprising:
a memory array comprising a plurality of memory cells; and
a control component coupled with the memory array, the control component configured to cause the apparatus to:
apply a plurality of voltages to the plurality of memory cells as part of a pre-read portion of a read operation;
apply a first read voltage to a memory cell of the plurality of memory cells to identify a logic state stored by the memory cell as part of a read portion of the read operation based at least in part on applying the plurality of voltages;
apply a second read voltage to the memory cell of the plurality of memory cells as part of the read portion of the read operation based at least in part on applying the first read voltage; and
determine the logic state stored by the memory cell based at least in part on applying the first read voltage and applying the second read voltage.

30. The apparatus of claim 29, wherein the control component is further configured to cause the apparatus to:
identify a first magnitude of the first read voltage based at least in part on applying the plurality of voltages, wherein applying the first read voltage is based at least in part on identifying the first magnitude of the first read voltage.

31. The apparatus of claim 30, wherein the control component is further configured to cause the apparatus to:
identify a second magnitude of the second read voltage based at least in part on identifying the first magnitude of the first read voltage, wherein applying the second read voltage is based at least in part on identifying the first magnitude of the first read voltage.

32. The apparatus of claim 29, wherein the control component is further configured to cause the apparatus to:
apply a first voltage to a first partition of the plurality of memory cells;
identify a first quantity of memory cells of the first partition in which a snapback event occurs based at least in part on applying the first voltage;
apply a second voltage to a second partition of the plurality of memory cells;
identify a second quantity of memory cells of the second partition in which the snapback event occurs based at least in part on applying the second voltage; and
identify a magnitude or a polarity or both of the first read voltage based at least in part on the first quantity and the second quantity.

33. A non-transitory computer-readable medium storing code comprising instructions which, when executed by a processor of an electronic device, cause the electronic device to:
apply a plurality of voltages to a plurality of memory cells as part of a pre-read portion of a read operation;
apply a first read voltage to a memory cell of the plurality of memory cells to identify a logic state stored by the memory cell as part of a read portion of the read operation based at least in part on applying the plurality of voltages;
apply a second read voltage to the memory cell of the plurality of memory cells as part of the read portion of the read operation based at least in part on applying the first read voltage; and determine the logic state stored by the memory cell based at least in part on applying the first read voltage and applying the second read voltage.

34. The non-transitory computer-readable medium of claim 33, wherein the instructions, when executed by the processor of the electronic device, further cause the electronic device to:
identify a first magnitude of the first read voltage based at least in part on applying the plurality of voltages, wherein applying the first read voltage is based at least in part on identifying the first magnitude of the first read voltage.

35. The non-transitory computer-readable medium of claim 33, wherein the instructions, when executed by the processor of the electronic device, further cause the electronic device to:
apply a first voltage to a first partition of the plurality of memory cells;
identify a first quantity of memory cells of the first partition in which a snapback event occurs based at least in part on applying the first voltage;
apply a second voltage to a second partition of the plurality of memory cells;
identify a second quantity of memory cells of the second partition in which the snapback event occurs based at least in part on applying the second voltage; and
identify a magnitude or a polarity or both of the first read voltage based at least in part on the first quantity and the second quantity.

* * * * *